United States Patent [19]
Li

[11] Patent Number: 6,137,375
[45] Date of Patent: Oct. 24, 2000

[54] LOSS CONTROL LOOP CIRCUIT FOR CONTROLLING THE OUTPUT VOLTAGE OF A VOLTAGE-CONTROLLED OSCILLATOR

[75] Inventor: Dandan Li, New York, N.Y.

[73] Assignee: The Trustees of Columbia University in the City of New York, New York, N.Y.

[21] Appl. No.: 09/322,448

[22] Filed: May 28, 1999

[51] Int. Cl.[7] .................................................. H03B 5/00
[52] U.S. Cl. ........................... 331/175; 331/96; 331/109; 331/117 R; 331/183; 333/17.1; 333/17.2; 333/24 R
[58] Field of Search ...................... 331/96, 109, 107 DP, 331/117 R, 117 FE, 117 D, 175, 182, 183, 185, 186; 33/17.1, 17.2, 24 R, 235

[56] References Cited

U.S. PATENT DOCUMENTS

| | | |
|---|---|---|
| 3,644,847 | 2/1972 | Neuman . |
| 3,649,929 | 3/1972 | Thompson ................................. 331/61 |
| 3,835,418 | 9/1974 | Gilbert ..................................... 331/141 |
| 5,117,205 | 5/1992 | Nauta . |
| 5,126,697 | 6/1992 | Nauta et al. ......................... 331/177 R |
| 5,303,394 | 4/1994 | Hrncirik . |
| 5,440,264 | 8/1995 | Sevenhans et al. . |
| 5,451,915 | 9/1995 | Katzin et al. . |
| 5,471,168 | 11/1995 | Sevenhans et al. . |
| 5,550,520 | 8/1996 | Kobayashi . |
| 5,731,737 | 3/1998 | Cranford, Jr. et al. . |
| 5,770,980 | 6/1998 | Barrett, Jr. et al. ............... 331/116 FE |

OTHER PUBLICATIONS

"A Practical Quality Factor Tuning Scheme for IF and High–Q Continuous–Time Filters," J.–M. Stevenson and E.S.–Sinencio, 1998 IEEE International Solid–State Circuits Conference, Digest of Technical Papers, vol. XVI, pp. 218–219.

"CMOS Active Filter Design at Very High Frequencies," Y.–T. Wang and A.A. Abidi, IEEE Journal of Solid–State Circuits, vol. 25, No. 6, Dec. 1990, pp. 1562–1574.

"Active GaAs MMIC Band–Pass Filters with Automatic Frequency Tuning and Insertion Loss Control," V. Aparin and P. Katzin, IEEE Journal of Solid–State Circuits, vol. 30, No. 10, Oct. 1995, pp. 1068–1073.

"A Si 1.8 GHz RLV Filter with Tunable Center Frequency and Quality Factor," S. Pipilos, Y.P. Tsividis, J. Fenk, and Y. Papananos, IEEE Journal of Solid–State Circuits, vol. 31, No. 10, OCt. 1996, pp. 1517–1524.

"A Syllabic Companding Translinear Filter," J. Mulder, W.A. Serdijn, A.C. van der Woerd, and A.H.M. van Roermund, 1997 IEEE International Symposium on Circuits and Systems, Jun. 9–12, 1997, Hong Kong, pp. 101–104.

"CMOS Triode Transconductor for Continuous–Time Active Integrated Filters," J.L. Pennock, Electronics Letters, Aug. 29, 1985, vol. 21, No. 18, pp. 817–818.

*Primary Examiner*—David Mis
*Attorney, Agent, or Firm*—Baker Botts LLP

[57] ABSTRACT

A circuit for controlling the loss of a VCO in a master-slave tuning system includes an envelope detector, an amplitude regulator, a current-mode circuit, and a low-pass filter. The envelope detector receives the VCO output voltage and provides VCO output envelope voltage, $V_{ENV}$. The amplitude regulator receives $V_{ENV}$ and a reference voltage, $V_{REF}$, and provides a sourcing current if $V_{ENV}$ is less than $V_{REF}$, and draws a sinking current if $V_{ENV}$ is greater than $V_{REF}$. The current-mode circuit receives $V_{ENV}$ and provides a control current, $I_Q$. The low-pass filter has high DC gain for integrating the control current and the sourcing or sinking current to provide the VCO control voltage, $V_{CON}$, to the VCO. The control current, $I_Q$, is proportional to the inverse of $V_{ENV}$ multiplied by the time derivative of $V_{ENV}$.

20 Claims, 14 Drawing Sheets

LOSS CONTROL LOOP CIRCUIT FOR CONTROLLING THE OUTPUT VOLTAGE OF A VOLTAGE-CONTROLLED OSCILLATOR

BACKGROUND OF THE INVENTION

1. Field of the Invention

This invention relates generally to microwave integrated filter tuning systems. More specifically, this invention relates to an improved circuit for automatically tuning and controlling loss in voltage-controlled oscillator (VCO) master-slave tuning systems incorporating microwave integrated filters.

2. Description of the Related Art

Interest in building single-chip wireless transceivers has fueled the integration of microwave continuous-time filters, of which automatic tuning systems are crucial parts. These tuning systems correct time constants and compensate for excess phase shift to make the filters immune to parasitics, technology tolerances, and temperature changes. One tuning approach uses a VCO and a frequency control circuit to set the time constant of a tracking filter. This system requires amplitude regulation to reduce distortion caused by the non-linearities of the active devices in the VCO in order to minimize the tuning error. Two major methods of regulation exist: (1) using limiters to limit the amplitude and (2) using a second control circuit, in addition to the frequency control circuit. Because of the non-linearity of the limiters, the first method causes a large frequency tuning error as the VCO's quality factor (Q) decreases. The second control circuit is used in the second method to make Q infinite and the amplitude small, and all elements of the second control circuit are intended to work in the linear region. In microwave integrated filter applications involving GHz-range coupled-resonator bandpass filters, the loss of the VCO must be tuned to zero.

The latter type of tuned-filter system discussed above is illustrated in FIG. 1. This system 10, often called a VCO master-slave tuning system, includes tuned filter 100 (also called an "indirectly" tuned filter), VCO 110, frequency control circuit 120, and Q-control circuit 130. VCO 110 is the "master" and tuned filter 100 is the "slave." The circuit topologies of the master and the slave are very similar, often including transconductance amplifiers, bandpass filters, coupled resonators, or a combination of these or other elements. Tuned filter 100 includes f and Q inputs which control the center frequency (in the case of a bandpass filter) and Q of tuned filter 100. These f and Q inputs are also provided to VCO 110. Frequency control circuit 120 is provided with a reference frequency $F_{REF}$ and typically includes a phase detector and a low-pass filter. When frequency control circuit 120 is combined in a loop with VCO 110, a phase-locked loop results, with the output of the VCO being fed back to frequency control circuit 120 to be compared with $F_{REF}$ in the phase detector. The output of the phase detector is low-pass-filtered and then provided to VCO 110 and tuned filter 100.

Q-control circuit 130 is provided with a reference voltage $V_{REF}$ and typically includes a rectifier, an adder, and a low-pass filter. When Q-control circuit 130 is combined in a loop with VCO 110, a loss control loop (or sometimes an amplitude-locked loop) results, with the output of Q-control circuit 130 being fed back to VCO 110 as control voltage $V_{CON}$. In theory, the two feedback loops in FIG. 1 may interact. However, if one loop is made much slower than the other one, the two loops can be considered decoupled. In order for the frequency control loop (phase-locked loop) to work effectively, the amplitude of the VCO output should neither be too small for the loop to detect zero-crossings, nor too large for a negative conductance that is part of the VCO to work in the linear region. Strong amplitude regulation may be realized by the loss control loop which is set faster than that of the frequency tuning loop. Thus, if a variable capacitor is used for frequency tuning, when the frequency tuning loop is much slower than the loss control loop, the capacitor can be considered invariant when analyzing the loss control loop.

In line with these assumptions, a VCO as depicted in FIG. 2A is chosen. FIG. 2A is a block diagram of a typical prior art loss control loop which includes VCO 210, rectifier 220, adder 230, and a circuit 240 having transfer function H(s). VCO 210 is depicted as an ideal fixed LC-tank circuit in parallel with $G_L$, a conductance which models the loss of the tank at the oscillation frequency, and tunable negative conductance $-G_N$. $G_L$ is the narrow-band equivalent loss contributed by inductor L and capacitor C. $G_N$ is the absolute value of the negative conductance which is controlled by $V_{CON}$ to tune out the loss. $G_N$ is assumed to increase monotonically with respect to $V_{CON}$. The output of VCO 210 is provided to rectifier 220. The rectified output, $V_{RECT}$, is subtracted from $V_{REF}$ in adder 230, and the difference is provided to circuit 240, a filter which provides gain and generates control voltage $V_{CON}$ to minimize the difference between the envelope of the VCO output, $V_{ENV}$, and $V_{REF}$. The envelope voltage, $V_{ENV}$, is the low frequency component of the rectified output, $V_{RECT}$. When $V_{ENV}$ is greater than $V_{REF}$, $G_N$ is made smaller to make the tank lossy and reduce the envelope voltage, $V_{ENV}$. If $V_{ENV}$ is less than $V_{REF}$, $G_N$ is increased, thus making Q negative and increasing the envelope voltage, $V_{ENV}$.

FIG. 2B illustrates a possible breadboard circuit realization of the prior art circuit of FIG. 2A. Circuit 240 is chosen as an integrator 270. (The signs on the inputs to adder 230 are reversed because of the minus sign introduced by integrator 270.) VCO 250 is realized as a differential LC-tank circuit in parallel with negative conductance circuit 260 which uses two MOSFETs biased in the triode region to act as variable resistors. Inserting resistors $R_1$ and $R_2$ in series with inductor $L_V$ reduces the Q of VCO 250 to about 10. Such a low Q is used to demonstrate the capability of the loop to control loss. Because this circuit is realized on a breadboard, the oscillation frequency of the tank circuit is low, around 3 MHz.

The goal of a loss control loop, when the loop settles, is to make Q infinite and the envelope voltage close to $V_{REF}$. However, the loops of FIGS. 2A and 2B, which are adequate for kHz-range systems, have stability problems at higher frequencies. When the bandwidth of circuit 240 having transfer function H(s) is much smaller than $$\frac{\omega_0}{2Q},$$

where $$\omega_0 = \frac{1}{\sqrt{LC}}$$

and $$Q = \frac{1}{G_L - G_N} \sqrt{\frac{C}{L}},$$

the control loop is unstable. Thus, as Q decreases or $\omega_o$ increases, the possibility of instability increases. For a low-Q tank circuit oscillating in the GHz range, a wide-bandwidth control required for the stability of the circuit is difficult to realize, and is not desirable due to the large high frequency leakage to $V_{CON}$. Realizing H(s) as an integrator, as in FIG. 2B, is supposed to provide very high DC gain to make $V_{ENV}=V_{REF}$. However, non-linear analysis demonstrates that the loss control loop will settle at $V_{ENV}=V_{REF}$ and $G_N(V_{CON})=G_L$ only if these are also the initial conditions. If they are not the initial conditions, the loss control loop will be unstable. During part of the period, $V_{ENV}$ may be large enough to drive the negative conductance into its non-linear region, and during part of the period it may be too small to be detected by the frequency tuning loop. The results of such a loss control loop, as implemented in the breadboard circuit, are shown in FIG. 2C. The top trace shows VCO output voltage as a function of time and the bottom trace shows VCO control voltage $V_{CON}$, as a function of time. In this instance, the peak-to-peak voltage of $V_{CON}$ is about 22 mV. Even though $V_{REF}$ is set to ~0.1V, the peak-to-peak oscillation amplitude of the VCO rises to 1V, and is limited only because of the non-linearities of negative conductance circuit 260. Increasing the time constant of the integrator does not reduce this problem. Moreover, the loop is also unstable when the integrator is replaced by a low-pass filter with narrow bandwidth.

As realized on a breadboard, the prior art control method can not provide effective amplitude regulation in the MHz range or at higher frequencies. The amplitude of the VCO output may sometimes be too small for the frequency tuning loop to detect zero-crossings of the VCO's output, or too large for the negative conductances to operate in the linear region, causing frequency tuning mismatch between VCO 110 and tuned filter 100. It is expected that the same is true at microwave frequencies, as well. Therefore, a need exists for an improved loss control loop circuit which tunes the loss of the VCO precisely and achieves robust amplitude regulation.

SUMMARY OF THE INVENTION

In accordance with the present invention, a loss control loop circuit for controlling the amplitude of the output voltage of a VCO which is controlled by a VCO control voltage includes an envelope detector which receives the VCO output voltage and provides VCO output envelope voltage, $V_{ENV}$, an amplitude regulator which receives $V_{ENV}$ and a reference voltage, $V_{REF}$, and provides a sourcing current if $V_{ENV}$ is less than $V_{REF}$, and draws a sinking current if $V_{ENV}$ is greater than $V_{REF}$, a current-mode circuit which receives $V_{ENV}$ and provides a control current, $I_Q$, a low-pass filter having high DC gain for integrating the control current and the sourcing or sinking current from the amplitude regulator to provide the VCO control voltage, $V_{CON}$, to the VCO, and means for providing $V_{CON}$ to the VCO.

The control current, $I_Q$, is proportional to the inverse of $V_{ENV}$ multiplied by the time derivative of $V_{ENV}$ $$\left(\text{i.e., } I_Q = \frac{1}{V_{ENV}} \frac{dV_{ENV}}{dt}\right).$$

The current-mode circuit preferably includes a transconductor which receives $V_{ENV}$ and provides a VCO output envelope current, $I_{ENV}$, first and second subcircuits, each of which receives $I_{ENV}$ and provides first and second drain currents, $I_1$ and $I_2$, the first subcircuit further including a current-drawing capacitor, $C_X$, and a current adder circuit which receives $I_1$ and $I_2$ and provides $I_Q$ as the difference current between $I_1$ and $I_2$. The difference current is the negative of the current drawn by $C_X$.

The low-pass filter is an integrator which includes a capacitor coupled between a circuit node and ground. The control current is provided to the circuit node, and the amplitude regulator sources current to or sinks current from the circuit node. The voltage at the circuit node is the VCO control voltage, $V_{CON}$. The amplitude regulator includes an output coupled to the circuit node, first and second current sources, first and second comparators each receiving $V_{ENV}$ and $V_{REF}$, and respective switch means associated with the first and second comparators. The first comparator and its associated switch means are responsive to $V_{ENV}$ being less than $V_{REF}$ to connect the first current source to the output of the amplitude regulator in order to source current to the circuit node. The second comparator and its associated switch means are responsive to $V_{ENV}$ being greater than $V_{REF}$ to connect the second current source to the output of the amplitude regulator to sink current from the circuit node.

The amplitude regulator includes a voltage difference detector and a charge pump. The voltage difference detector receives $V_{ENV}$ and $V_{REF}$ and provides an up signal if $V_{ENV}$ is less than $V_{REF}$ and provides a down signal if $V_{ENV}$ is greater than $V_{REF}$. The charge pump receives the up and down signals and provides sourcing current if the up signal is high and draws sinking current if the down signal is high.

Also provided is a loss control loop circuit for stabilizing the amplitude of the output voltage of a VCO which is controlled by a VCO control voltage which includes an envelope detector which receives the VCO output voltage and provides $V_{ENV}$, a current-mode circuit which receives $V_{ENV}$ and provides a control current, $I_Q$, a low-pass filter having high DC gain for integrating the control current to provide the VCO control voltage, $V_{CON}$, to the VCO, and means for providing $V_{CON}$ to the VCO.

An important difference over the prior art, which included a VCO whose control voltage is provided at the output of a filter, is the inclusion of an envelope detector that generates $V_{ENV}$ and an amplitude regulator and a current-mode circuit that are coupled in parallel between the output terminal of the envelope detector and the input terminal of the filter. The filter is a low-pass filter having high DC gain. The current-mode circuit converts $V_{ENV}$ to a current proportional to the inverse of $V_{ENV}$ multiplied by the time derivative of $V_{ENV}$. It is preferable that a microwave integrated filter has its loss controlled by the loss control loop circuit of the present invention.

A master-slave filter tuning system is also provided which uses the loss control loop circuit described above as a Q-control circuit. Also included in the system are a tuned filter which receives an input voltage and provides a filtered output voltage, and which also receives a frequency control signal and a Q-control signal. The system also includes a frequency control circuit which provides the tuned filter frequency control signal, a Q-control circuit which provides the tuned filter Q-control signal, and a voltage-controlled oscillator (VCO) which receives the tuned filter frequency control signal and the tuned filter Q-control signal and provides a VCO output voltage. The Q-control circuit includes an envelope detector which receives the VCO output voltage and provides $V_{ENV}$, an amplitude regulator which receives $V_{ENV}$ and $V_{REF}$ and provides a sourcing current if $V_{ENV}$ is less than $V_{REF}$, and draws a sinking current if $V_{ENV}$ is greater than $V_{REF}$, a current-mode circuit which receives $V_{ENV}$ and provides control current $I_Q$, and a low-pass filter having high DC gain for integrating $I_Q$ and the sourcing or sinking current from the amplitude regulator to provide the VCO control voltage, $V_{CON}$, to the VCO. The control current, $I_Q$, is proportional to the inverse of $V_{ENV}$ multiplied by the time derivative of $V_{ENV}$.

A method for controlling the amplitude of the output voltage of a VCO includes deriving from the VCO output voltage a VCO output envelope voltage, $V_{ENV}$, converting $V_{ENV}$ to a control current, $I_Q$, proportional to the inverse of $V_{ENV}$ multiplied by the time derivative of $V_{ENV}$, supplying $I_Q$ to a circuit node of a low-pass filter having high DC gain, comparing $V_{ENV}$ with reference voltage $V_{REF}$, sourcing current to the circuit node if $V_{ENV}$ is less than $V_{REF}$, sinking current from the circuit node if $V_{ENV}$ is greater than $V_{REF}$, using the voltage at the circuit node as the VCO control voltage, $V_{CON}$, and providing $V_{CON}$ to the VCO to control the VCO output voltage. Converting $V_{ENV}$ to $I_Q$ includes first converting $V_{ENV}$ to a VCO output envelope current, $I_{ENV}$ supplying $I_{ENV}$ to first and second subcircuits which generate first and second subcircuit drain currents, and subtracting the first subcircuit drain current from the second subcircuit drain current to generate $I_Q$. The first and second subcircuits are identical except that one of the first and second subcircuits has a capacitance current path for its subcircuit drain current. The method uses a capacitor to integrate $I_Q$ and the sourced or sunk current to provide $V_{CON}$.

Another method is provided for stabilizing the amplitude of the output voltage of a VCO. This method includes deriving $V_{ENV}$ from the VCO output voltage, converting $V_{ENV}$ to a control current, $I_Q$, proportional to the inverse of $V_{ENV}$ multiplied by the time derivative of $V_{ENV}$, supplying $I_Q$ to a circuit node of a low-pass filter having high DC gain, using the voltage at the circuit node as the VCO control voltage, $V_{CON}$, and providing $V_{CON}$ to the VCO to control the VCO output voltage.

Another method is provided for tuning the loss of a slave filter in a VCO master-slave tuning system, in which the system includes a VCO that provides an output voltage. This method derives from the VCO output voltage a VCO output envelope voltage, $V_{ENV}$, tunes the loss of the VCO close to zero by converting $V_{ENV}$ to a control current, $I_Q$, proportional to the inverse of $V_{ENV}$ multiplied by the time derivative of $V_{ENV}$, and constraining the amplitude of the VCO output voltage by supplying $I_Q$ to a circuit node of a low-pass filter having high DC gain, comparing $V_{ENV}$ with reference voltage $V_{REF}$, sourcing current to the circuit node if $V_{ENV}$ is less than $V_{REF}$, sinking current from the circuit node if $V_{ENV}$ is greater than $V_{REF}$, using the voltage at the circuit node as the VCO control voltage, $V_{CON}$, and providing $V_{CON}$ to the VCO to control the VCO output voltage. Converting $V_{ENV}$ to $I_Q$ includes first converting $V_{ENV}$ to a VCO output envelope current, $I_{ENV}$, supplying $I_{ENV}$ to first and second subcircuits which generate first and second subcircuit drain currents, and subtracting the first subcircuit drain current from the second subcircuit drain current to generate $I_Q$. The first and second subcircuits are identical except that one of the first and second subcircuits has a capacitance current path for its subcircuit drain current.

The present invention provides various technical advantages. As used in a filter tuning system, one technical advantage is that the VCO loss can be precisely controlled and VCO output amplitude can be accurately regulated. These features ensure good matching between the master VCO and the slave filter. Another technical advantage is controlling the Q of the VCO by generating a control current that is proportional to the inverse of the VCO envelope voltage multiplied by the time derivative of that voltage. Then, the VCO envelope voltage can be controlled by controlling the VCO control voltage, $V_{CON}$, which is derived by sourcing or sinking a small current that is added to the control current, and the sum current is integrated by a capacitor to yield $V_{CON}$. A steady-state limit cycle of the VCO output voltage can then be generated within a narrow, defined range.

BRIEF DESCRIPTION OF THE DRAWINGS

For a more complete understanding of the present invention and the advantages thereof, reference is now made to the following detailed description taken in conjunction with the accompanying drawings, wherein like reference numerals represent like parts or components, in which.

DETAILED DESCRIPTION

Figure 1:
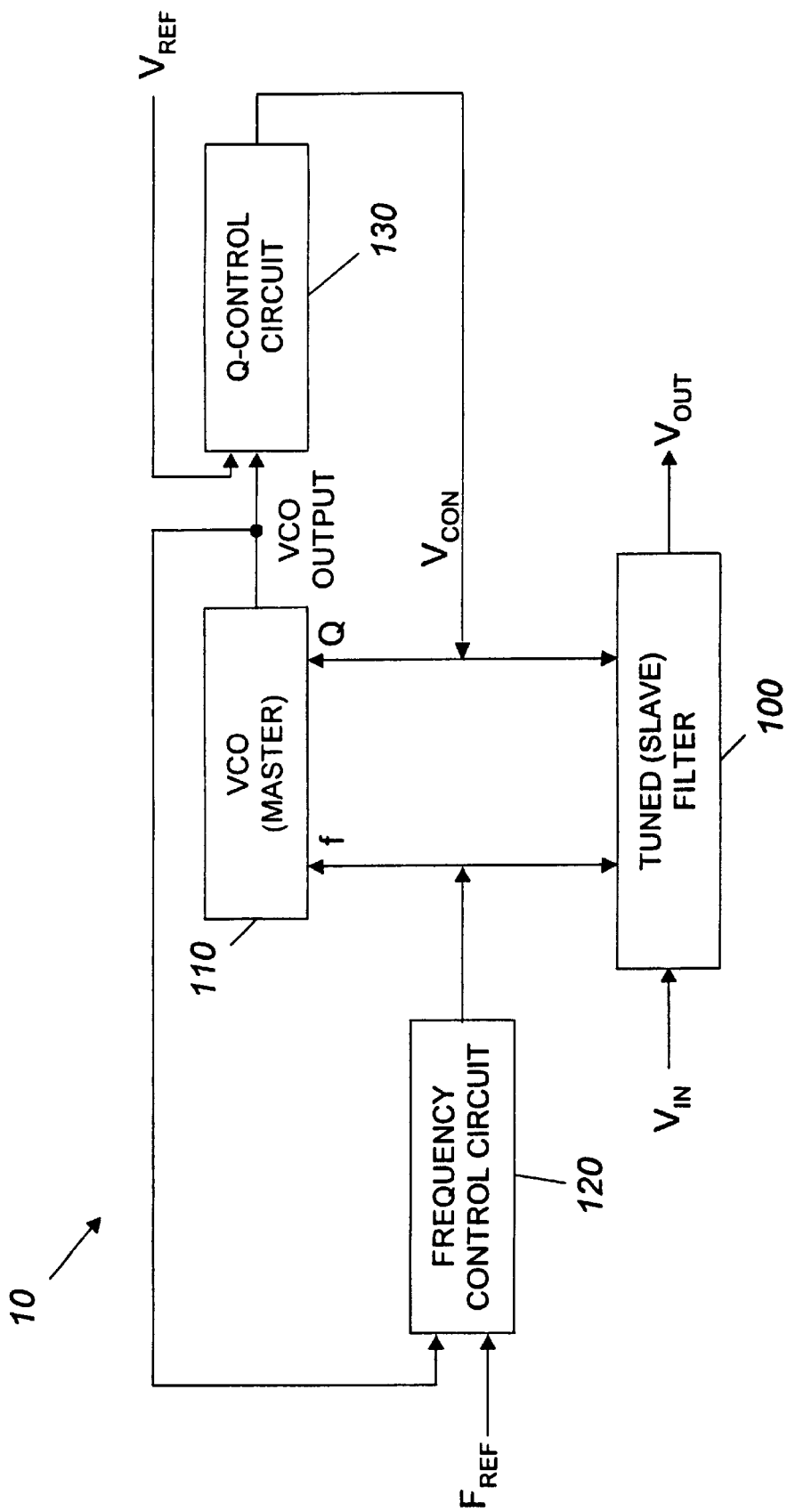
FIG. 1 is a block diagram of a VCO master-slave tuning system into which the present invention may be incorporated.

The present invention provides a loss control loop circuit made up of VCO 110 and Q-control circuit 130 of FIG. 1.

This loss control loop circuit controls the Q of VCO 110 while regulating the amplitude of the output of the VCO. In the prior art loss control loop circuit in FIG. 2A, which includes VCO 210, rectifier 220, voltage adder 230, and a circuit 240 having transfer function H(s), the VCO output envelope voltage (low-pass-filtered output of rectifier 220) is measured in an attempt to control the Q of the VCO tank circuit. But the relation between the envelope voltage, $V_{ENV}$, and Q is weak—setting the value of Q equal to infinity does not uniquely set the value of $V_{ENV}$, and therefore $V_{ENV}$ cannot be used as a measurement of Q. The circuit is thus not able to adequately control the VCO output, as shown in FIG. 2C. The loss control loop circuit of the present invention uses a much better Q measurement. A current-mode circuit based on this Q measurement controls the Q of tuned system 10, and an amplitude regulator, consisting of a voltage difference detector and a charge pump, regulates the amplitude of the VCO output. The sum of the currents generated by the current-mode circuit and the amplitude regulator is integrated by a low-pass filter having high DC gain. By properly choosing the value of a capacitor in the current-mode circuit, the current sources in the charge pump, and the frequency response of the low-pass filter, $V_{ENV}$ and the VCO control voltage, $V_{CON}$, can both be kept within narrow limits in the steady state. $V_{CON}$ is then able to be averaged or sampled and held in order to control the frequency of tuned filter 100. The Q measurement method is first described, followed by a method of determining the system parameters.

The envelope voltage, $V_{ENV}$, can be approximated by $$V_{ENV} = V_0 e^{-\frac{\omega_0}{2Q}t} = V_0 e^{-\frac{G_L - G_N}{2C}t}, \quad (1)$$

where $V_O$ represents the initial condition of $V_{ENV}$ and ($\omega_o$ and Q were earlier defined in terms of L, C, $G_L$, and $G_N$ of VCO 210. To extract information about Q from $V_{ENV}$, the function $$\frac{1}{V_{ENV}} \frac{d V_{ENV}}{dt}$$

is formed. Using Equation (1), $$\frac{1}{V_{ENV}} \frac{d V_{ENV}}{dt} = -\frac{\omega_0}{2Q}. \quad (2)$$

Examination of Equation 2 shows that the function $$\frac{1}{V_{ENV}} \frac{d V_{ENV}}{dt}$$

has a unique relation to Q. This function can be conveniently implemented by current-mode circuit 300, illustrated in FIG. 3A, which is based on a circuit found in J. Mulder et al., "A Syllabic Companding Translinear Filter," Proceedings ISCAS '97, pp. 101–104.

Current-mode circuit 300 includes transconductor 310, current adder 320, identical NPN bipolar transistors $Q_1$ and $Q_2$, identical n-channel MOSFETs $M_1$ and $M_2$, identical n-channel MOSFETs $M_3$ and $M_4$ forming DC current sources $I_0$ controlled by $V_{bias\ n1}$, frequency compensation capacitors $C_1$ and $C_2$, and capacitor $C_x$. $V_{ENV}$ is provided to transconductor 310, a voltage-to-current converter, which outputs two equal currents $I_{ENV}$. One realization of transconductor 310 is shown in FIG. 3B. This transconductor uses NPN bipolar transistors $Q_3$, $Q_4$, $Q_5$, $Q_6$, a MOSFET current source $M_{15}$ controlled by bias voltage $V_{bias\ n2}$, and a high-swing current mirror made of six p-channel MOSFETs $M_9$–$M_{14}$ and controlled by $V_{bias\ p2}$. The value of $V_{bias\ p2}$ is such that $M_9$, $M_{10}$, and $M_{11}$ operate at the edge of the saturation region. Current-mode circuit 300 is made of two nearly identical subcircuits 311 and 312, each of which includes one of the two NPN bipolar transistors $Q_1$, $Q_2$, two of the n-channel MOSFETs $M_1$ and $M_3$, $M_2$ and $M_4$, and one of the frequency compensation capacitors $C_1$, $C_2$. The difference between the subcircuits is that subcircuit 311 also includes capacitor $C_x$ through which a current $I_x$ flows. Subcircuits 311 and 312 respectively generate $I_1$ and $I_2$, the drain currents of MOSFETs $M_1$ and $M_2$, respectively, both of which are provided to current adder 320. Current adder 320 is a current mirror which includes four p-channel MOSFETs, $M_5$ –$M_8$. The sources of $M_7$ and $M_8$ are connected to supply voltage $V_{dd}$, typically 3V. The drains of $M_7$ and $M_8$ are respectively connected to the sources of $M_5$ and $M_6$. The gates of $M_7$ and $M_8$ are coupled together and to the drains of $M_6$ and $M_2$. The gates of $M_5$ and $M_6$ are coupled together and to a bias voltage $V_{bias\ p1}$ which is used in a high-swing current mirror biasing scheme. Like $V_{bias\ p2}$ the value of $V_{bias\ p1}$ is chosen so that $M_7$ and $M_8$ operate at the edge of the saturation region. The drain of $M_5$ is connected to the drain of $M_1$, from which the output current, $I_Q$, is taken. $I_Q$ of current-mode circuit 300 is the difference between $I_2$ and $I_1$.

These two currents, $I_1$ and $I_2$, are generated as follows. In each subcircuit, $I_{ENV}$ is provided to the collector of bipolar transistor $Q_1$ or $Q_2$, whose emitter is coupled to ground. The gate of MOSFET $M_1$ or $M_2$ is coupled to the collector of one of the bipolar transistors. The source of MOSFET $M_1$ or $M_2$ is coupled to the base of bipolar transistor $Q_1$ or $Q_2$, respectively, from which the DC current source $I_0$ is provided to ground. The frequency compensation capacitors $C_1$ and $C_2$ have the same value and are connected between the gate and source of MOSFET $M_1$ and $M_2$, respectively. These capacitors are adjusted to reduce the ringing of $I_1$ and $I_2$. The drain of MOSFET $M_1$ or $M_2$ is connected to current adder 320. According to Mulder et al., the current $I_x$ through $C_x$ is equal to $$C_x V_T \frac{1}{I_{ENV}} \frac{d I_{ENV}}{dt} = C_x V_T \frac{1}{V_{ENV}} \frac{d V_{ENV}}{dt}.$$

where $V_T$ is the bipolar transistor thermal voltage $$\frac{kT}{q}.$$

From equation (2), $$I_x = -C_x V_T \frac{\omega_0}{2Q}. \quad (3)$$

Because $I_Q = I_2 - I_1$, and the only difference between the two subcircuits is the current $I_x$, $$I_Q = -I_x = C_x V_T \frac{\omega_0}{2Q} = C_x V_T \frac{G_L - G_N}{2C}. \quad (4)$$

As realized, current-mode circuit 300 also compensates for finite beta effect.

Figure 2A:
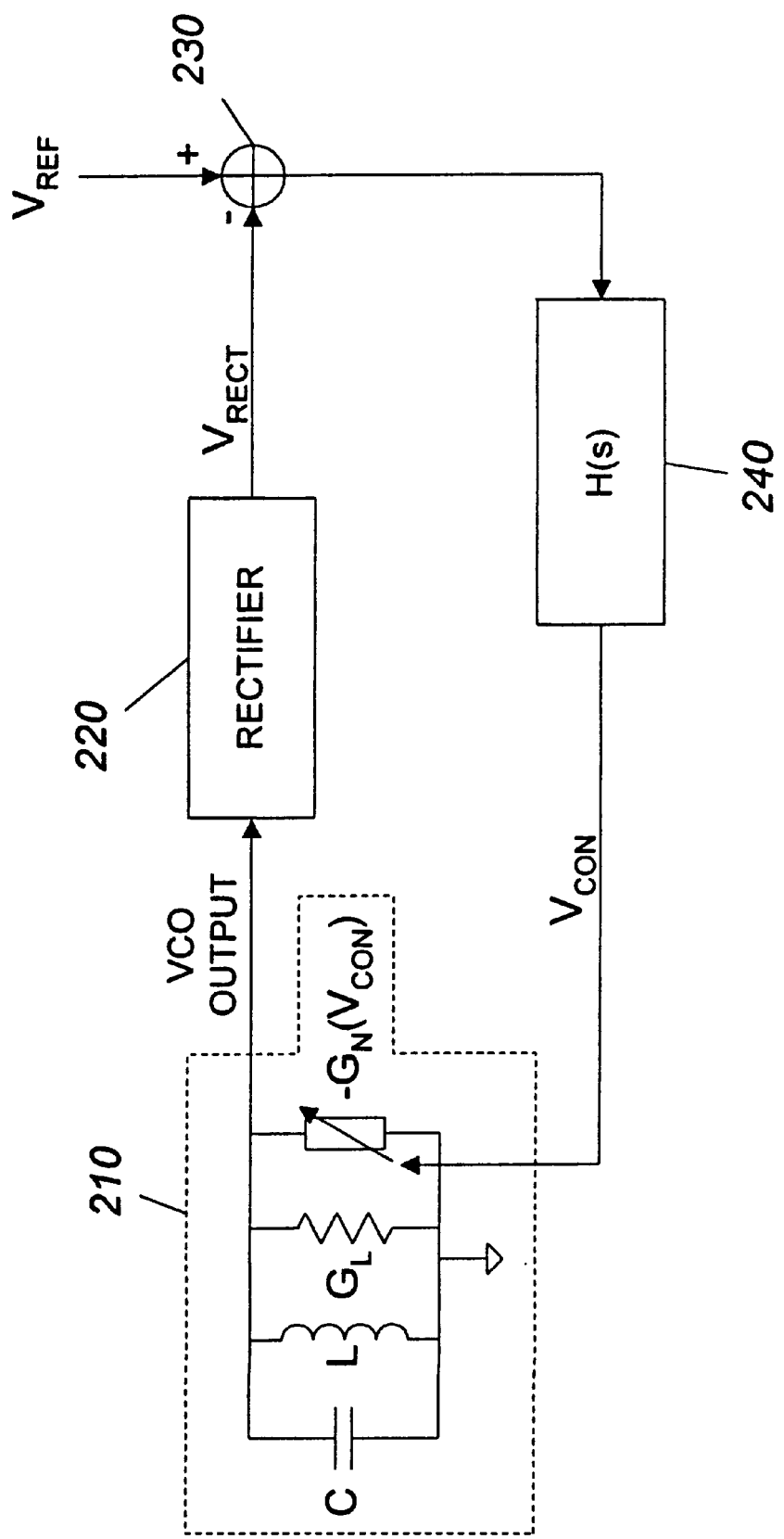
FIG. 2A is a block diagram of a prior art loss control loop circuit with amplitude regulation.
Figure 3A:
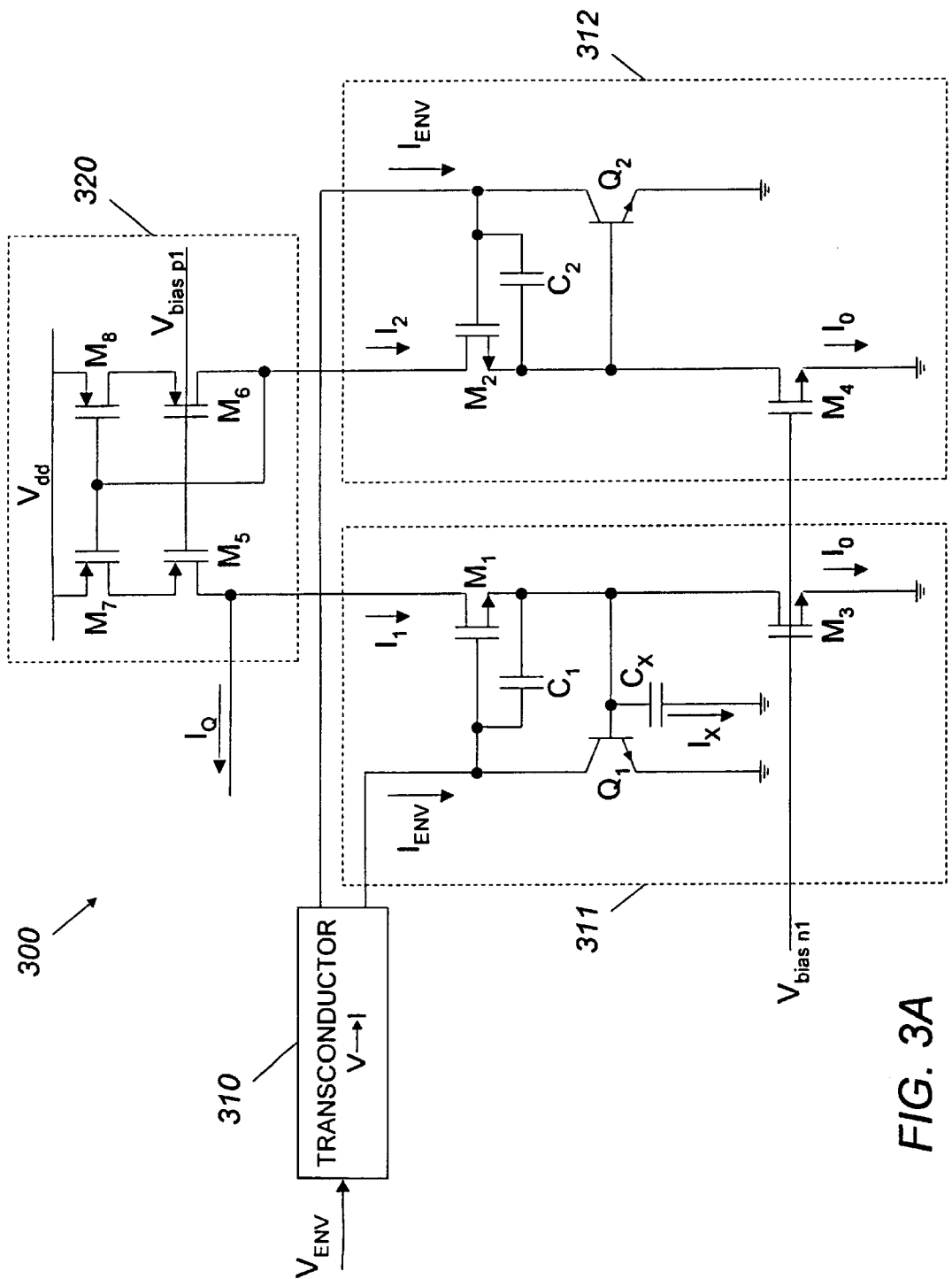
FIG. 3A is a schematic diagram of a current-mode circuit used in an embodiment of the loss control loop circuit of the present invention.
Figure 3B:
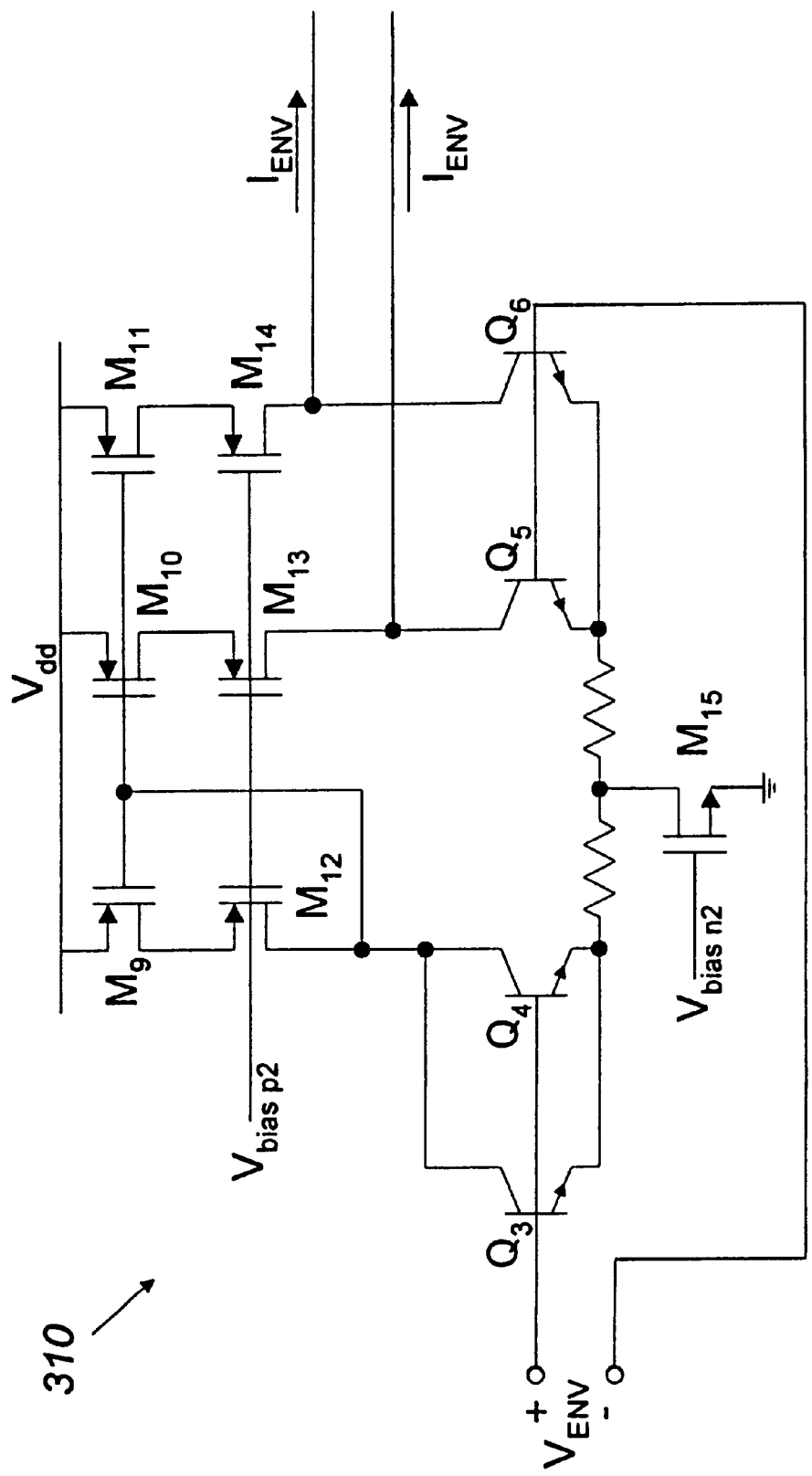
FIG. 3B is a schematic diagram of an embodiment of a transconductor that may be used in the current-mode circuit of FIG. 3A.
Figure 4:
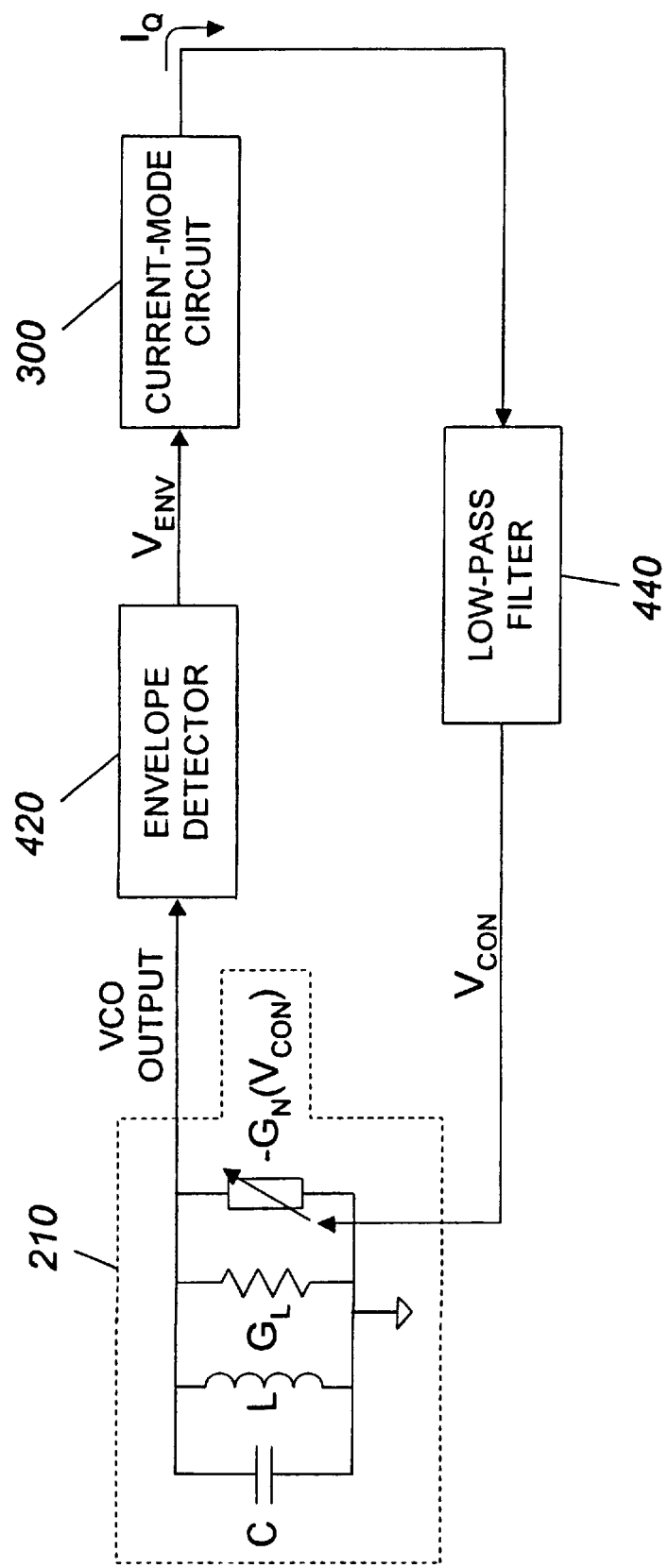
FIG. 4 is a block diagram of an embodiment of the loss control loop circuit of the present invention without amplitude regulation.

Referring to FIGS. 4 and 2A, the loss control loop circuit of FIG. 2A can be modified to include current-mode circuit 300 of FIG. 3A. An envelope detector 420 replaces rectifier 220, circuit 240 is replaced by low-pass, high DC gain filter 440, and current-mode circuit 300 is placed between envelope detector 420 and low-pass filter 440. The resulting loss control loop circuit controls Q, and thus equivalently controls the function $$\frac{1}{V_{ENV}} \frac{dV_{ENV}}{dt},$$

but it does not control $V_{ENV}$ itself. When the loop in FIG. 4 makes Q infinite, Equation (2) shows that $$\frac{1}{V_{ENV}} \frac{dV_{ENV}}{dt} = 0,$$

independent of the value of $V_{ENV}$ (assuming $V_{ENV} \neq 0$). Thus the value of $V_{ENV}$ is not controllable using the circuit of FIG. 4.

Figure 5:
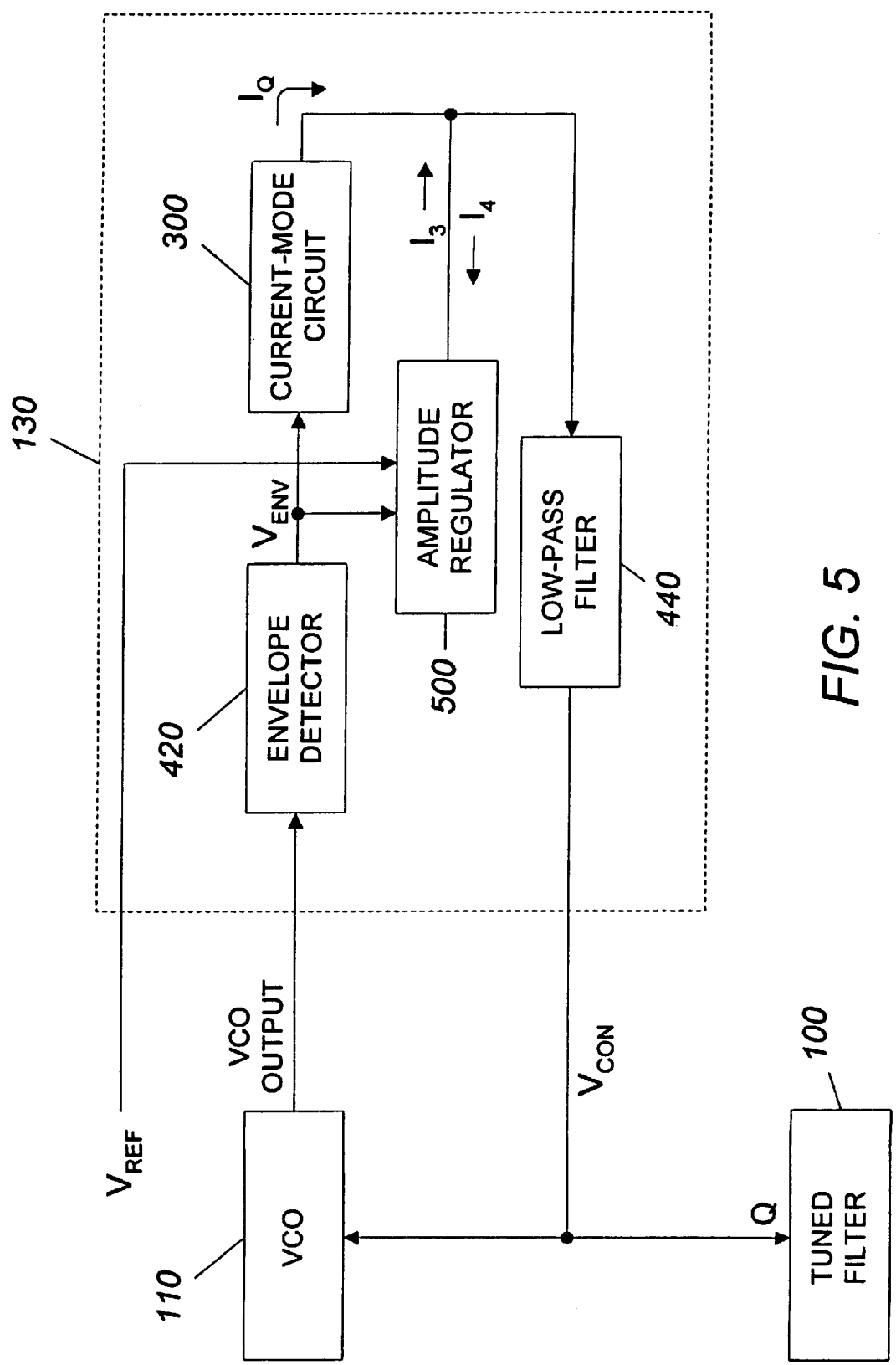
FIG. 5 is a block diagram of the loss control loop circuit of the present invention including amplitude regulation.
Figure 6A:
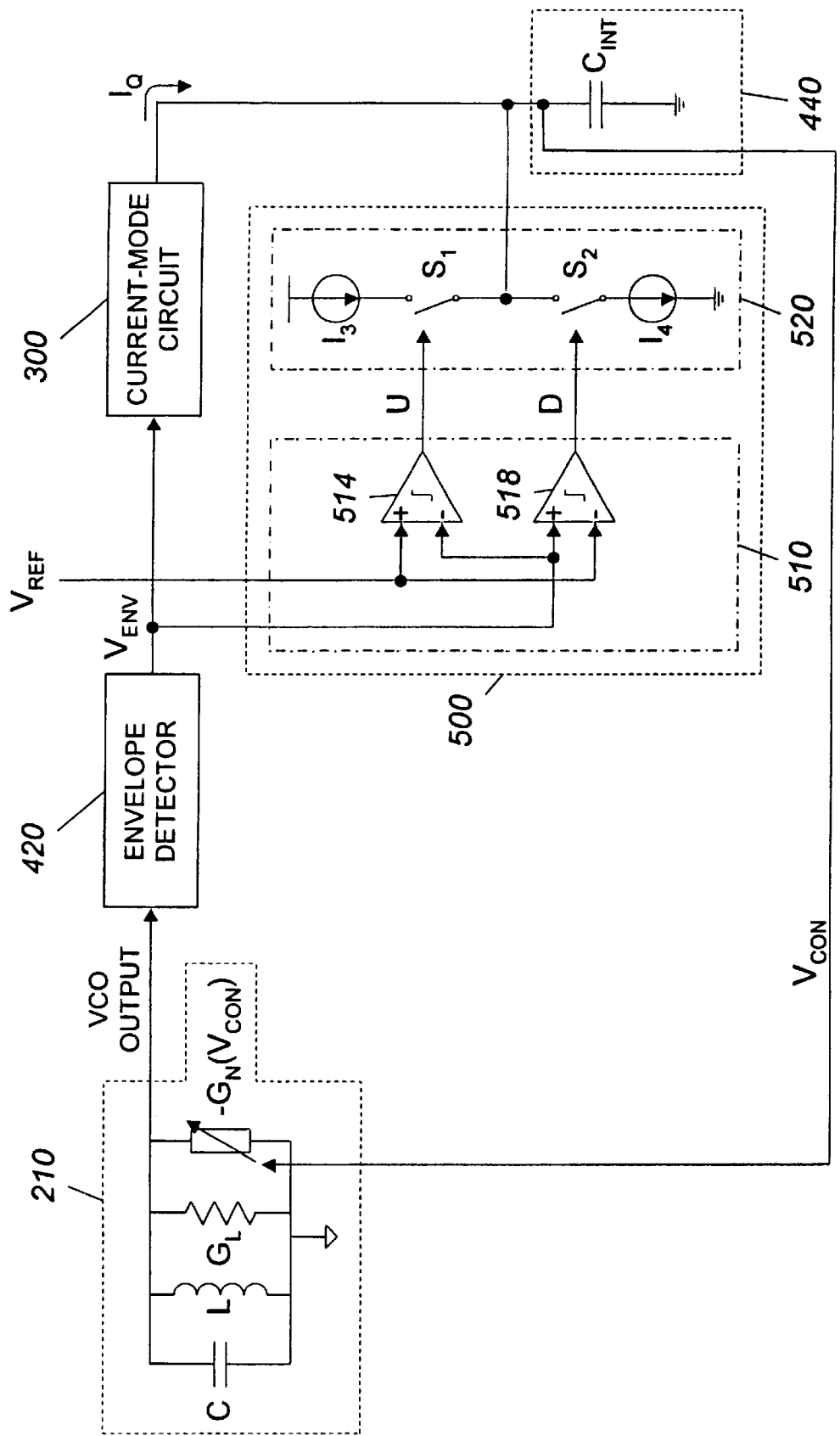
FIG. 6A is a block diagram of an embodiment of the loss control loop circuit of FIG. 5.
Figure 6B:
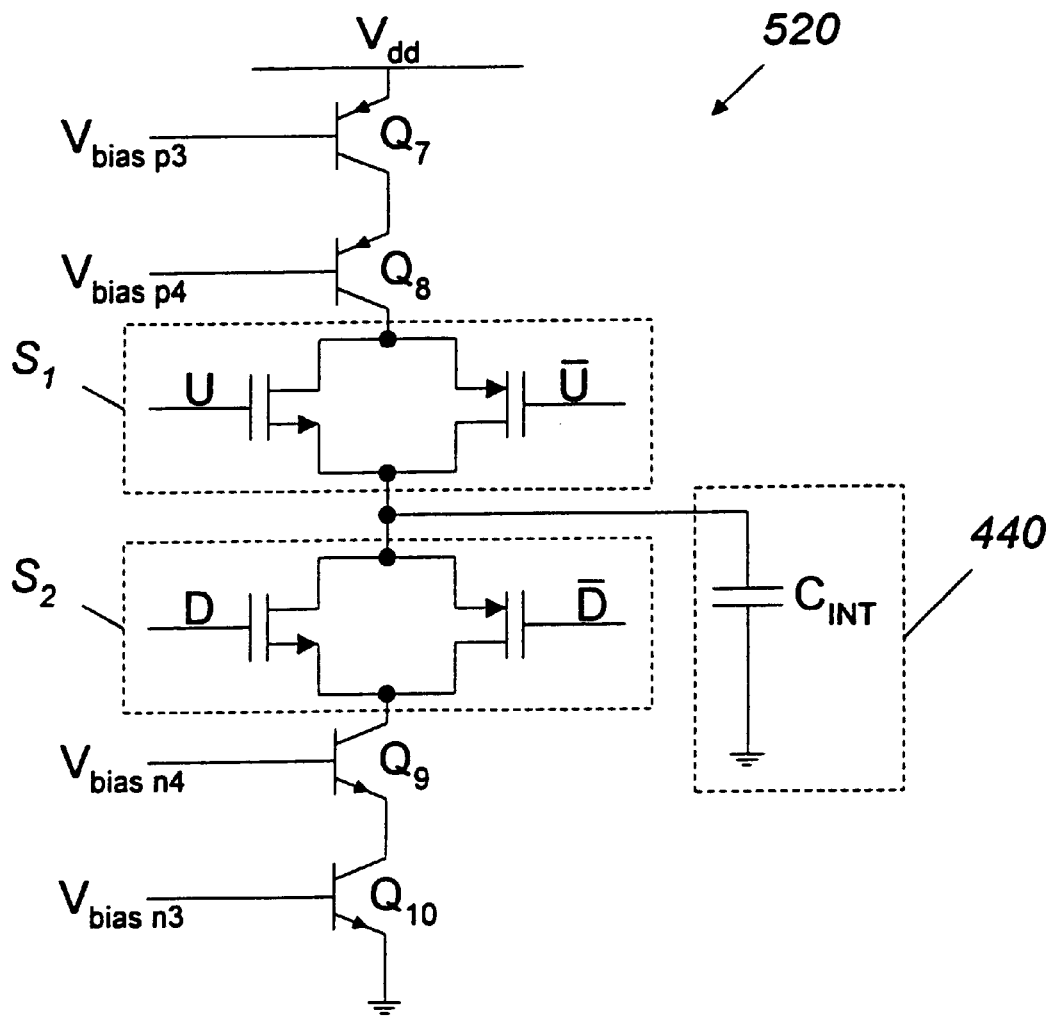
FIG. 6B is a schematic diagram of an embodiment of a charge pump that may be used in the loss control loop circuit of FIG. 6A.

In order to control $V_{ENV}$, the loop circuit of FIG. 4 can be modified as shown in FIG. 5. An amplitude regulator 500 can be placed in parallel with current-mode circuit 300 of FIG. 3A, i.e. between envelope detector 420 and low-pass, high DC gain filter 440. A preferred embodiment is shown in FIG. 6A, in which amplitude regulator 500 consists of a voltage difference detector 510 and a charge pump 520. Voltage difference detector 510 includes two comparators 514, 518, arranged to output "up" and "down" signals U, D to charge pump 520, which includes two DC current sources $I_3$, $I_4$ and two CMOS switches $S_1$, $S_2$. Each CMOS switch $S_1$, $S_2$ includes an n-channel MOSFET, into which the U or D signal is provided, and a p-channel MOSFET, into which the inverse U or D signal is provided. One type of charge pump 520 is pictured in FIG. 6B. In that figure, current source $I_3$ is made of two PNP bipolar transistors $Q_7$, $Q_8$ connected in series between $V_{dd}$ and switch $S_1$. Analogously, current source $I_4$ is made of two NPN bipolar transistors $Q_9$, $Q_{10}$ connected in series between $S_2$ and ground. The bases of the four bipolar transistors $Q_7$, $Q_8$, $Q_9$, $Q_{10}$ of the charge pump shown in FIG. 6B are controlled by four bias voltages $V_{bias\ p3}$, $V_{bias\ p4}$, $V_{bias\ n3}$, $V_{bias\ n4}$, whose values are chosen based on the values chosen for $I_3$ and $I_4$, as will be shown later. In order to have high DC gain, low-pass filter 440 can be realized as an integrator, which ideally has infinite gain at DC. A simple, one-pole integrator is shown in FIGS. 6A and 6B as an integrating capacitor, $C_{INT}$. When Q is infinite, making $I_Q$=0, if $V_{REF} > V_{ENV}$, the output U of comparator 514 goes high sending a signal to charge pump 520 to connect $I_3$ to the output of amplitude regulator 500, which charges $C_{INT}$, increasing $V_{CON}$. This increases $G_N$, thus increasing $V_{ENV}$, as seen in the latter part of Equation (1). Conversely, if $V_{REF} < V_{ENV}$, the output D of comparator 518 goes high sending a signal to charge pump 520 to connect 14 to the output of amplitude regulator 500, which discharges $C_{INT}$, decreasing $V_{CON}$ and decreasing $G_N$, thus decreasing $V_{ENV}$.

This amplitude control scheme causes the loop to be unstable, generating a limit cycle in the steady state. However, by properly choosing the values of $I_3$, $I_4$, $C_x$, and $C_{INT}$, both $V_{ENV}$ and $V_{CON}$ can be kept within narrow, desired limits in the steady state. The desired limit for $V_{ENV}$ is where the negative conductance $G_N$ operates in its linear region. The desired limit for $V_{CON}$ is where the Q of each of the coupled resonators in tuned filter 100, which is equal to the Q of VCO 110, will be large enough to have little effect on the frequency response of tuned filter 100. The value of $V_{CON}$ can now be either averaged or sampled and held in order to control the frequency of tuned filter 100.

Figure 2B:
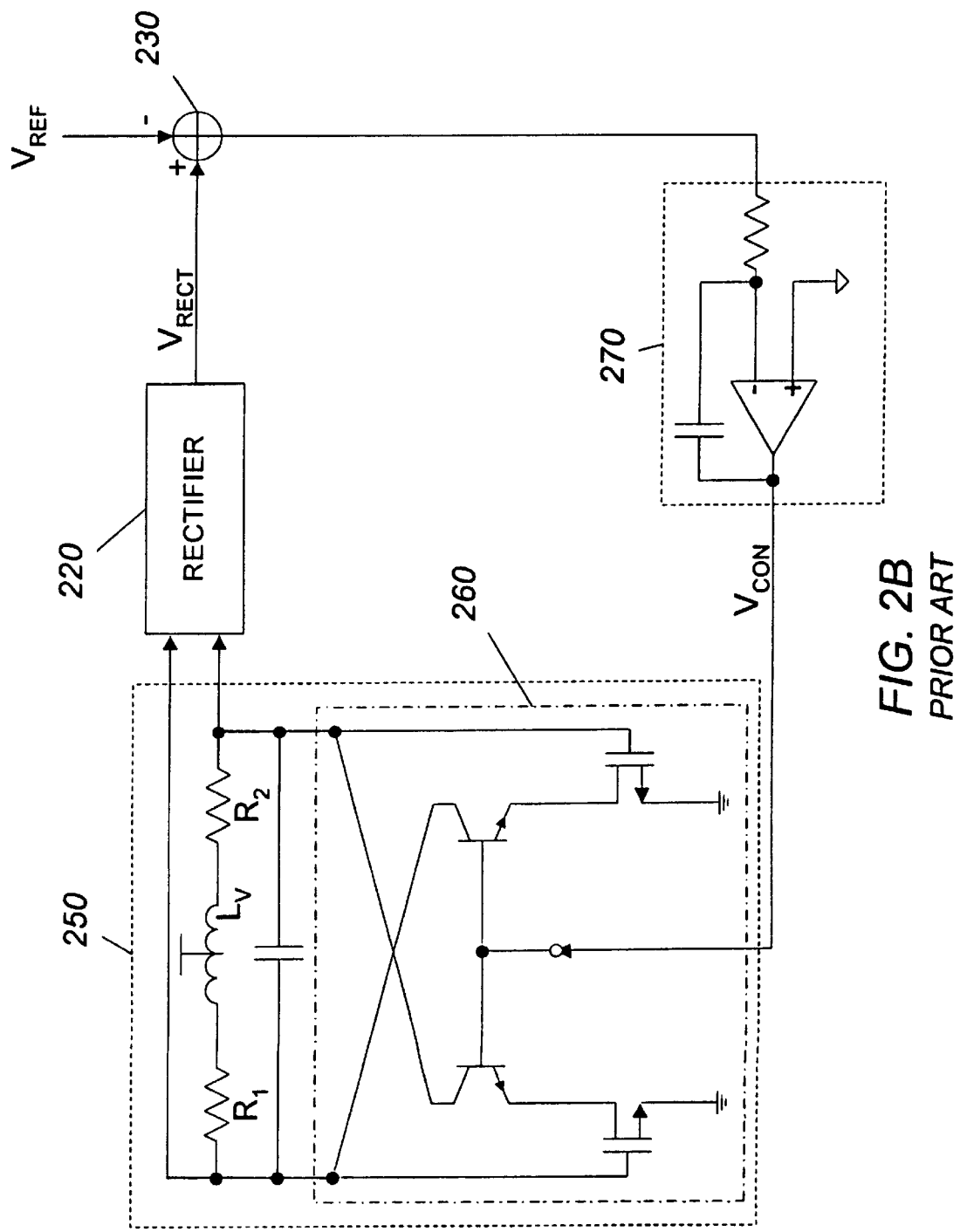
FIG. 2B is a schematic diagram of a low-frequency breadboard realization of the prior art loss control loop circuit of FIG. 2A.
Figure 2C:
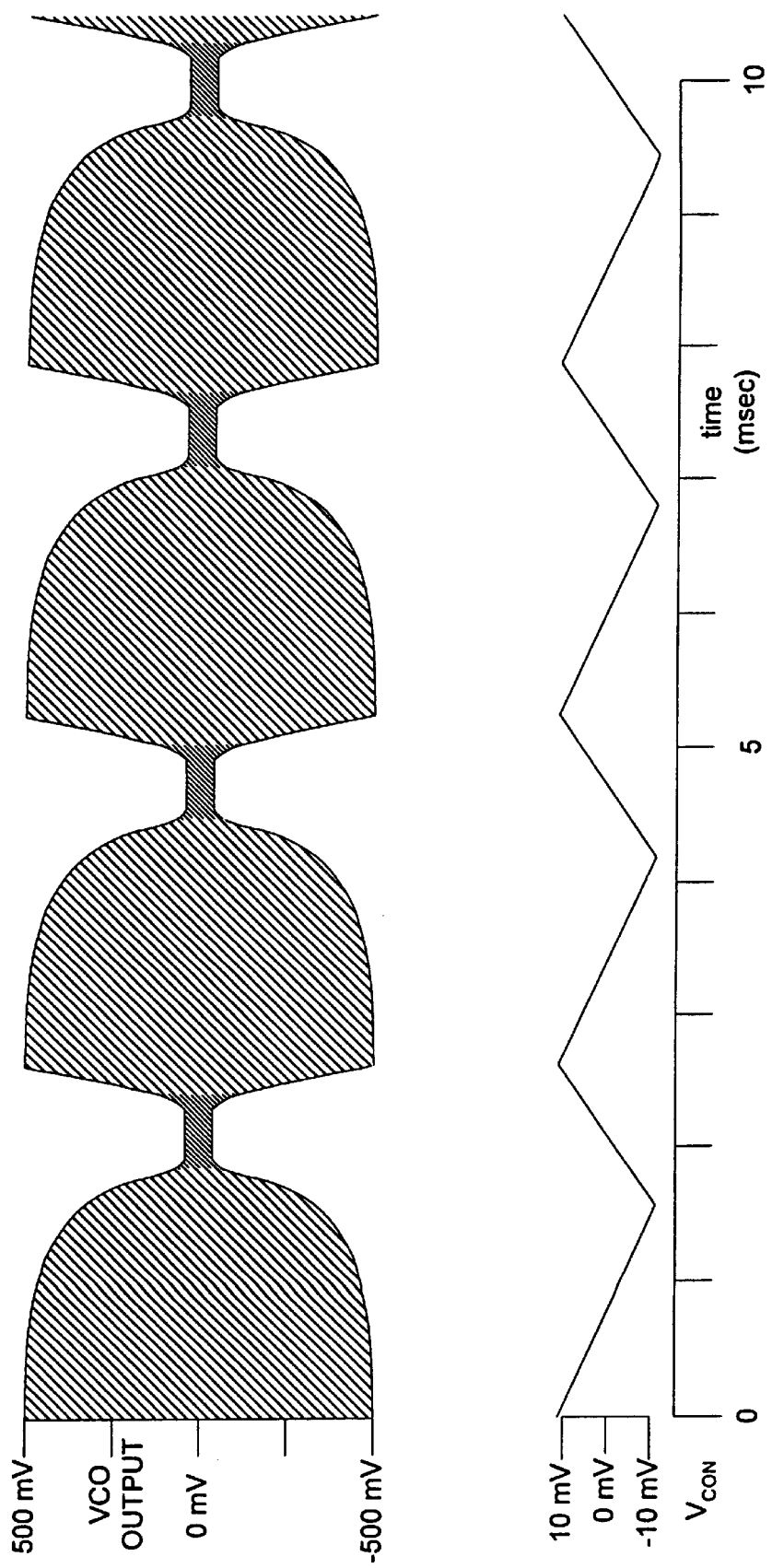
FIG. 2C illustrates the VCO output voltage and the VCO control voltage using the breadboard realization of the prior art loss control loop circuit of FIGS. 2A and 2B.
Figure 7:
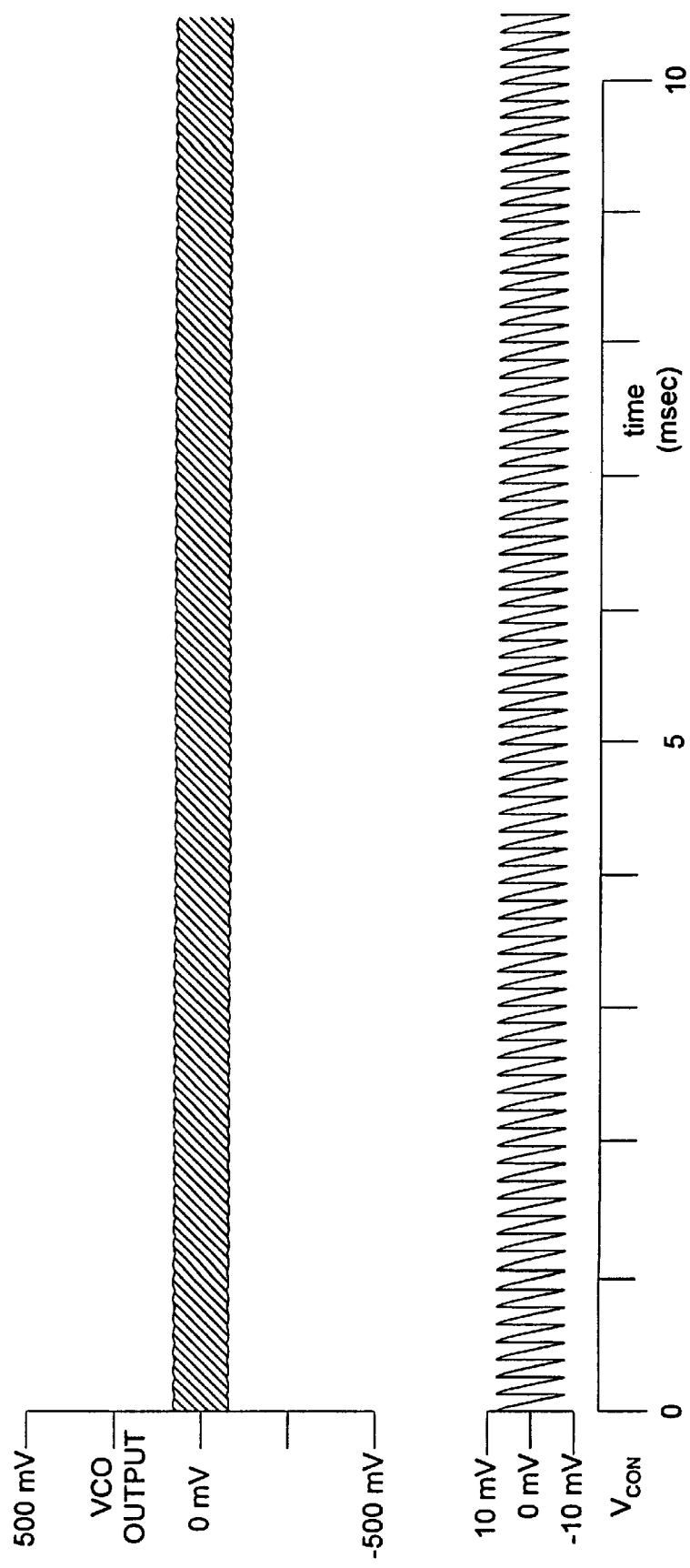
FIG. 7 illustrates the VCO output voltage and the VCO control voltage using the embodiment of the present invention of FIGS. 6A and 6B.

FIG. 7 shows the results of a breadboard circuit realization of the loss control loop circuit of FIG. 6A. VCO 210 of FIG. 6A is realized as the same circuit as VCO 250 in FIG. 2B, with a differential LC-tank circuit having a Q purposefully reduced to about 10, and the circuit has an oscillation frequency of 3 MHz. $V_{REF}$ is again set to be ~0.1V. However, unlike the prior art circuit results shown in FIG. 2C, the peak-to-peak envelope amplitude of the output of the VCO is nearly constant around 160 mV. Similarly, the peak-to-peak excursion of $V_{CON}$ in the loss control loop of the present invention is only about 16 mV as compared to about 22 mV in the prior art. The fundamental frequency of the VCO control voltage is on the order of 8 kHz.

Figure 8A:
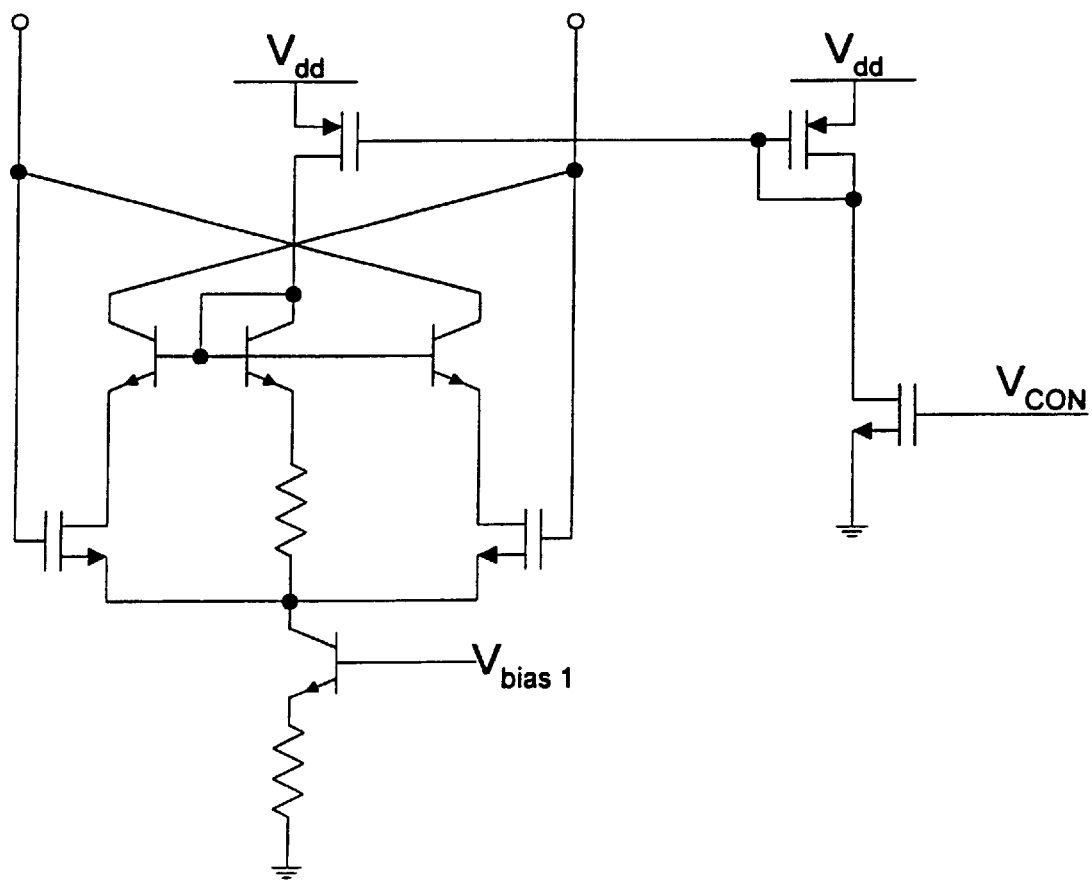
FIGS. 8A and 8B are schematic diagrams of negative conductance circuits that may be used in a high-frequency embodiment of the present invention.
Figure 8B:
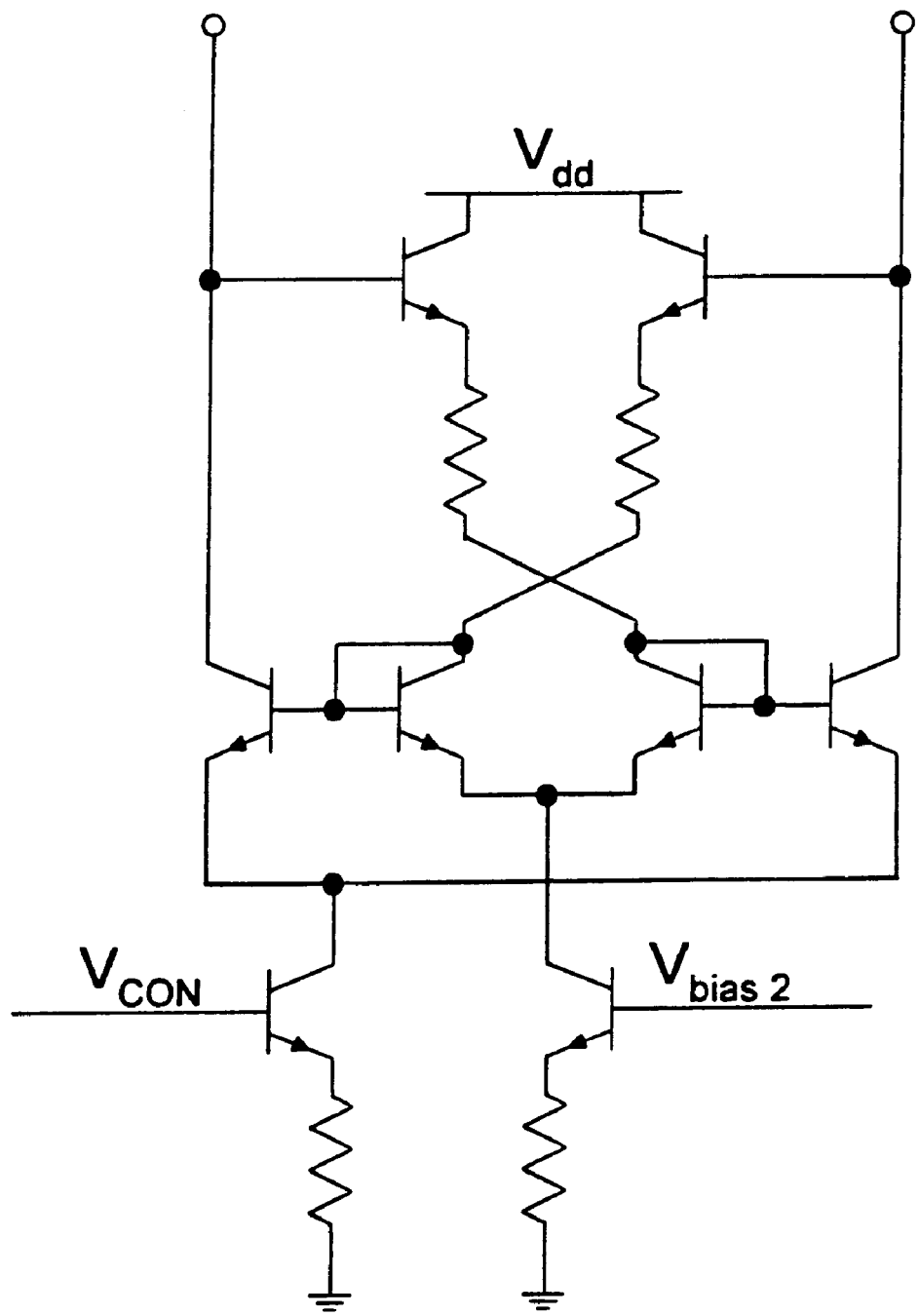
Figure 8C:
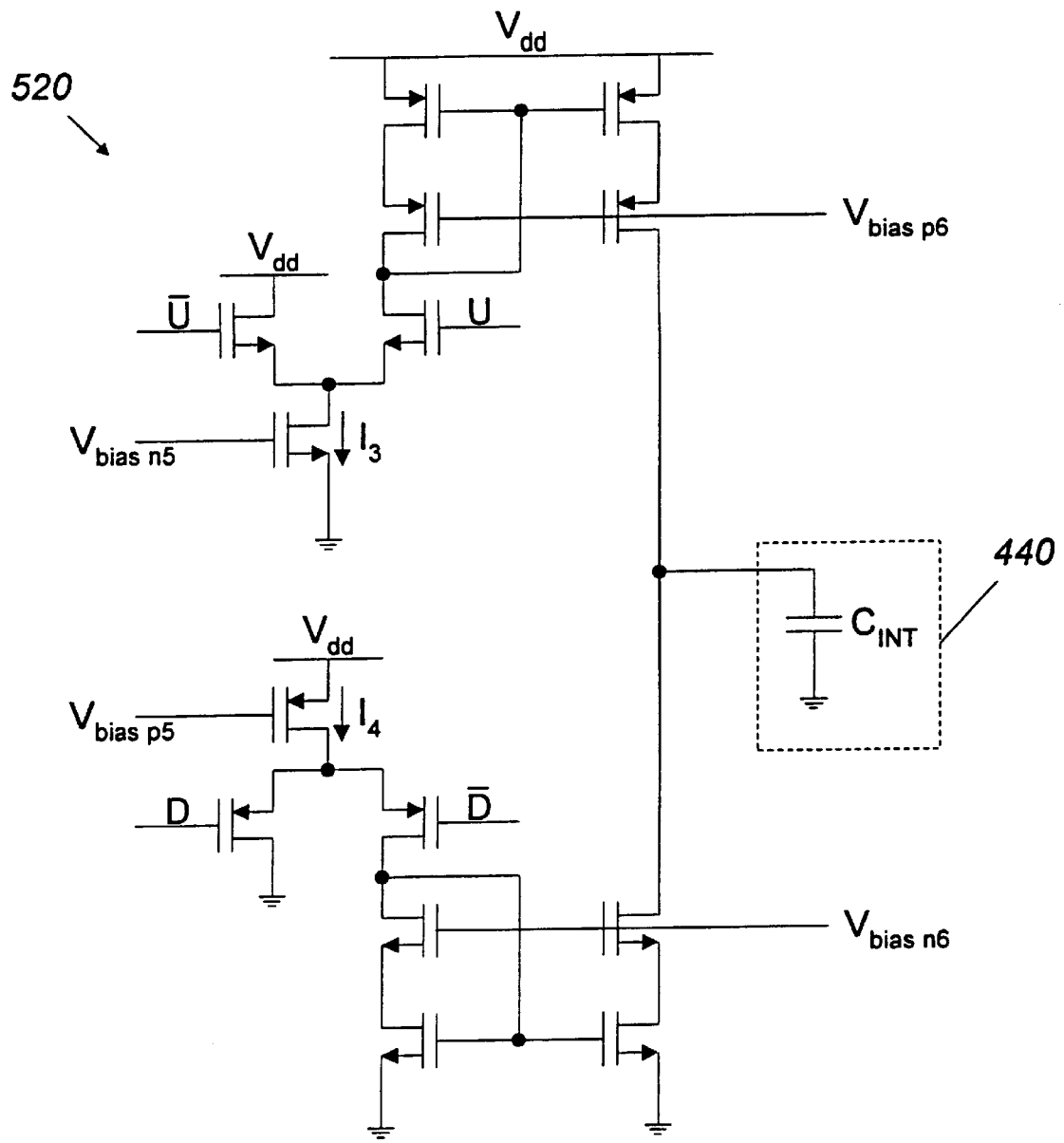
FIG. 8C is a schematic diagram of a charge pump that may be used in a high-frequency embodiment of the present invention.

The present invention is preferably used in circuits that operate in the GHz range, rather than the low-MHz range described above. In this region, the circuits of FIGS. 8A–8C can be used. FIGS. 8A and 8B are schematic diagrams of examples of negative conductance circuits 260 that may be used in a high-frequency embodiment of the present invention. Many different negative conductance circuits that can be used at high frequencies will be known to those skilled in the art. The choice of the actual components is based on the technology used and the parasitics associated with the technology. The structure of the negative conductance circuit is not as important for choosing loop design parameters as the relationship between $G_N$ and $V_{CON}$. The circuit of FIG. 8A is similar to negative conductance circuit 260 (FIG. 2B), but has been modified to achieve better performance and to include biasing. The circuit of FIG. 8B is another example of a negative conductance circuit designed with only resistors and NPN bipolar transistors. FIG. 8C is a schematic diagram of an example of a charge pump 520 that may be used in a high-frequency embodiment of the present invention. As with the charge pump in FIG. 6B, this charge pump uses the both the up and down signals from voltage difference detector 510 as well as the inverse up and down signals.

Next, it will be demonstrated how the values of $I_3$, $I_4$, $C_x$, and $C_{INT}$ are chosen for a circuit in the GHz-frequency range of interest. Although Q of VCO 210 is intended to be infinite, in practical applications, a Q of only about 20 times as large as the Q of tuned filter 100 is required. For a coupled resonator bandpass filter having a center frequency of 1.8 GHz and a Q of about 15, the minimum acceptable Q of VCO 210 is chosen to be 300. If Q were infinite, $I_Q$ would equal zero. However, for a finite Q, $I_Q$ is chosen to be large enough to be detected over the offset currents of current-mode circuit 300. Those offset currents can be as large as several microamps, thus, $I_Q$ is chosen to be somewhere between 15–25 μA. $C_x$ can be found using Equation (4). Using exemplary values of $I_Q$=20 μA, $V_T$=25.9 mV, and $\omega_o=2\pi f_o=2\pi(1.8\times10^9)$ yields $C_x$=41 pF.

Because the Q-control loop within FIG. 6A is considered the dominant loop over the amplitude regulation loop, parameters are first set to optimize $I_Q$, then they are set to optimize the regulation loop. Thus, $I_3$ and $I_4$ are configured as perturbation currents that move $V_{ENV}$ closer to $V_{REF}$, and are therefore chosen to be less than $I_Q$. Moreover, although $I_3$ and $I_4$ do not have to be equal, it is preferable that they are. Thus, for $I_Q$=20 μA, $I_3$ and $I_4$ are chosen to be 10 μA.

The last value to be chosen is that of $C_{INT}$. As discussed in the Background section, it is desirable to have one of the frequency and Q-control loops made much slower than the other one, so that the two loops can be considered decoupled. The speed of a linear feedback loop can be measured by the unity gain frequency of its open loop transfer function. The larger the unity gain frequency, the faster the loop. As will be seen below, although the Q-control loop is non-linear, it can be still approximated by a linear loop. In the present invention, the unity gain frequency of the Q-control loop is chosen to be at least ten times that of the frequency control loop. If the frequency control loop is configured as a phase-locked loop (PLL), its unity gain frequency can be typically chosen to be 200–300 times less than the reference frequency, $F_{REF}$. The value of $F_{REF}$ is normally set by a crystal oscillator, whose preferred value is below 20 MHz. $F_{REF}$ is related to $\omega_o$ ($f_o$) in that $f_o$ is an integral power of 2 multiple of $F_{REF}$ (using a divider in the feedback loop of the PLL). Thus, for $f_o$=1.8 GHz, and using a multiple of $2^7$=128 to bring $F_{REF}$ below 20 MHz, $F_{REF}$ becomes 14.06 MHz. Choosing the PLL open loop unity gain bandwidth to be 250 times less than $F_{REF}$ results in a unity gain bandwidth of 56.25 kHz. Choosing the unity gain frequency of the Q-control loop to be at least 20 times larger results in a frequency $f_Q$=1.125 MHz.

Choosing $C_{INT}$ requires performing a small-signal analysis. Assume that $G_N$ can be approximated by a first-order polynomial function of its control voltage, $V_{CON}$ (i.e. $G_N = kV_{CON} + G_{N0}$, where k and $G_{N0}$ are constants). Using Equation (4), small-signal current $$i_Q = C_x V_T \frac{-kV_{CON}}{2C},$$

because $G_L$ does not change with $V_{CON}$. The open-loop transfer function from $V_{CON}$ to $i_Q$ in the top of the loop of FIG. 6A is $$\frac{i_Q}{V_{CON}} = \frac{-kC_x V_T}{2C}.$$

The transfer function from $i_Q$ to $V_{CON}$ in the bottom of the loop of FIG. 6A is $$\frac{V_{CON}}{i_Q} = \frac{1}{sC_{INT}}.$$

The open loop transfer function becomes $$\frac{-kC_x V_T}{2CC_{INT}s},$$

and the unity gain frequency $$2\pi f_Q = \frac{kC_x V_T}{2CC_{INT}}.$$

In this equation C is the value of the capacitor in the LC-tank that is the basis of the VCO. For $f_o$=1.8 GHz, C is chosen to be 1 pF and L is chosen to be 7.8 nH. For k=2×10$^{-3}$ mho/V, $C_{INT}$=150 pF.

The response of the system operated in the preferred frequency range yields similar results as those shown in FIG. 7, with controlled $V_{CON}$ and output VCO voltage. The only difference is that the fundamental frequency of the control voltage, $V_{CON}$, is approximately three orders of magnitude faster than that shown in FIG. 7, i.e. approximately 5–10 MHz. The prior art circuit, which was not able to operate on a breadboard at 3 MHz, is also not able to operate at 1.8 GHz.

Thus, although the prior art loss control loop circuit may provide useful Q-control voltage, it does not provide effective amplitude regulation, which is crucial for the accuracy of frequency tuning. The loss control loop circuit of the present invention solves this problem and provides better frequency tuning matching by averaging or sampling and holding $V_{CON}$.

Although the preferred embodiment of the loss control loop circuit is detailed herein, the invention is not limited to this preferred embodiment. Other types of current-mode circuits may be used, so long as they output a current which is proportional to $$\frac{1}{V_{ENV}} \frac{dV_{ENV}}{dt}.$$

Other amplitude regulation schemes and other schemes for comparing $V_{ENV}$ and $V_{REF}$ to derive amplitude regulation sourcing and sinking currents to be integrated by $C_{INT}$ may be used, as well as other charge pumps. The values of the parameters and components of the preferred embodiment, including the center frequency and Q, are also not fixed, but may be varied based on the IC technology used, available component values, component tolerances, and the preferences of the circuit designer.

While several embodiments have been illustrated and described, other variations and alternate embodiments will occur to those skilled in the art without departing from the spirit and scope of this invention, as defined by the appended claims.

I claim:

1. A loss control loop circuit for controlling the amplitude of the output voltage of a voltage-controlled oscillator (VCO), said VCO output voltage being controlled by a VCO control voltage, said circuit comprising:
   an envelope detector coupled to receive said VCO output voltage and providing a VCO output envelope voltage;
   an amplitude regulator coupled to receive said VCO output envelope voltage and a reference voltage, said amplitude regulator providing a sourcing current if said VCO output envelope voltage is less than said reference voltage, and drawing a sinking current if said VCO output envelope voltage is greater than said reference voltage;
   a current-mode circuit coupled to receive said VCO output envelope voltage and providing a control current;
   a low-pass filter having high DC gain for integrating said control current and said sourcing or sinking current from said amplitude regulator to provide said VCO control voltage to the VCO; and
   means for providing said VCO control voltage to the VCO.

2. The circuit according to claim 1, wherein said control current is proportional to the inverse of said VCO output envelope voltage multiplied by the time derivative of said VCO output envelope voltage.

3. The circuit according to claim 1, wherein said current-mode circuit comprises:
   a transconductor coupled to receive said VCO output envelope voltage and providing a VCO output envelope current;
   first and second subcircuits, each subcircuit coupled to receive said VCO output envelope current and providing first and second drain currents, said first subcircuit further comprising a current-drawing capacitor; and an current adder coupled to receive said first and second drain currents and providing said control current as the difference current between said first subcircuit drain current and said second subcircuit drain current, wherein said difference current is the negative of the current drawn by said current-drawing capacitor.

4. The circuit according to claim 1, wherein said integrator comprises a capacitor coupled between a first node and ground, and wherein said control current is provided to said first node, and said amplitude regulator sources current to or sinks current from said first node, the voltage at said first node being said VCO control voltage.

5. The circuit according to claim 4, wherein said amplitude regulator comprises:
an output coupled to said first node;
first and second current sources;
first and second comparators each being coupled to receive said VCO output envelope voltage and said reference voltage; and
respective switch means associated with said first and second comparators,
said first comparator and its associated switch means being responsive to said VCO output envelope voltage being less than said reference voltage for connecting said first current source to the output of said amplitude regulator to source current to said first node, and
said second comparator and its associated switch means being responsive to said VCO output envelope voltage being greater than said reference voltage for connecting said second current source to the output of said amplitude regulator to sink current from said first node.

6. The circuit according to claim 1, wherein said amplitude regulator comprises:
a voltage difference detector coupled to receive said VCO output envelope voltage and said reference voltage, said voltage difference detector providing an up signal if said VCO output envelope voltage is less than said reference voltage, and providing a down signal if said VCO output envelope voltage is greater than said reference voltage; and
a charge pump coupled to receive said up and down signals and providing said sourcing current if said up signal is high and drawing said sinking current if said down signal is high.

7. The circuit according to claim 6, wherein said voltage difference detector comprises:
first and second comparators each being coupled to receive said VCO output envelope voltage and said reference voltage,
said first comparator being responsive to said VCO output envelope voltage being less than said reference voltage for providing said high up signal to the output of said voltage difference detector, and
said second comparator being responsive to said VCO output envelope voltage being greater than said reference voltage for providing said high down signal to the output of said voltage difference detector.

8. The circuit according to claim 6, wherein said charge pump comprises:
an output coupled to a first node;
first and second current sources; and
respective switch means associated with said first and second current sources,
said first current source and its associated switch means being responsive to said high up signal for connecting said first current source to the output of said charge pump to source current to said first node, and
said second current source and its associated switch means being responsive to said high down signal for connecting said second current source to the output of said charge pump to sink current from said first node,
wherein the voltage at said first node is said VCO control voltage.

9. A microwave integrated filter whose loss is controlled by said loss control loop circuit specified in claim 1.

10. A loss control loop circuit for stabilizing the amplitude of the output voltage of a voltage-controlled oscillator (VCO), said VCO output voltage being controlled by a VCO control voltage, said circuit comprising:
an envelope detector coupled to receive said VCO output voltage and providing a VCO output envelope voltage;
a current-mode circuit coupled to receive said VCO output envelope voltage and providing a control current;
a low-pass filter having high DC gain for integrating said control current to provide said VCO control voltage to the VCO; and
means for providing said VCO control voltage to the VCO.

11. The circuit according to claim 10, wherein said control current is proportional to the inverse of said VCO output envelope voltage multiplied by the time derivative of said VCO output envelope voltage.

12. A master-slave filter tuning system comprising:
a tuned filter coupled to receive an input voltage, a frequency control signal, and a Q-control signal, and providing a filtered output voltage;
a frequency control circuit providing said tuned filter frequency control signal;
a Q-control circuit providing said tuned filter Q-control signal; and
a voltage-controlled oscillator (VCO) coupled to receive said tuned filter frequency control signal and said tuned filter Q-control signal and providing a VCO output voltage,
wherein said Q-control circuit comprises:
an envelope detector coupled to receive said VCO output voltage and providing a VCO output envelope voltage;
an amplitude regulator coupled to receive said VCO output envelope voltage and a reference voltage, said amplitude regulator providing a sourcing current if said VCO output envelope voltage is less than said reference voltage, and drawing a sinking current if said VCO output envelope voltage is greater than said reference voltage;
a current-mode circuit coupled to receive said VCO output envelope voltage and providing a control current; and
a low-pass filter having high DC gain for integrating said control current from said current-mode circuit and said sourcing or sinking current from said amplitude regulator to provide said VCO control voltage to the VCO.

13. The circuit according to claim 12, wherein said control current is proportional to the inverse of said VCO output envelope voltage multiplied by the time derivative of said VCO output envelope voltage.

14. A method for controlling the amplitude of the output voltage of a voltage-controlled oscillator (VCO), said VCO output voltage being controlled by a VCO control voltage, said method comprising the steps of:

deriving from said VCO output voltage a VCO output envelope voltage;

converting said VCO output envelope voltage to a control current proportional to the inverse of said VCO output envelope voltage multiplied by the time derivative of said VCO output envelope voltage;

supplying said control current to a first node of a low-pass filter having high DC gain;

comparing said VCO output envelope voltage with a reference voltage;

sourcing current to said first node if said VCO output envelope voltage is less than said reference voltage;

sinking current from said first node if said VCO output envelope voltage is greater than said reference voltage;

using the voltage at said first node as a VCO control voltage; and providing said VCO control voltage to the VCO to control said VCO output voltage.

15. The method according to claim 14, wherein said converting step comprises the steps of:

converting said VCO output envelope voltage to a VCO output envelope current;

supplying said VCO output envelope current to first and second subcircuits generating first and second subcircuit drain currents, said first and second subcircuits being identical except for a capacitance current path for the subcircuit drain current in one of said first and second subcircuits; and subtracting said first subcircuit drain current from said second subcircuit drain current to derive said control current.

16. The method according to claim 14, further comprising the step of:

integrating with a capacitance said control current and said sourced or sunk current to provide said VCO control voltage.

17. A method for stabilizing the amplitude of the output voltage of a voltage-controlled oscillator (VCO), said VCO output voltage being controlled by a VCO control voltage, said method comprising the steps of:

deriving from said VCO output voltage a VCO output envelope voltage;

converting said VCO output envelope voltage to a control current proportional to the inverse of said VCO output envelope voltage multiplied by the time derivative of said VCO output envelope voltage;

supplying said control current to a first node of a low-pass filter having high DC gain;

using the voltage at said first node as a VCO control voltage; and providing said VCO control voltage to the VCO to control said VCO output voltage.

18. The method according to claim 17, wherein said converting step comprises the steps of:

converting said VCO output envelope voltage to a VCO output envelope current;

supplying said VCO output envelope current to first and second subcircuits generating first and second subcircuit drain currents, said first and second subcircuits being identical except for a capacitance current path for the subcircuit drain current in one of said first and second subcircuits; and subtracting said first subcircuit drain current from said second subcircuit drain current to derive said control current.

19. A method for tuning the loss of a slave filter in a voltage-controlled oscillator (VCO) master-slave tuning system having a VCO providing a VCO output voltage, said method comprising the steps of:

deriving from said VCO output voltage a VCO output envelope voltage;

tuning the loss of the VCO close to zero by converting the VCO output envelope voltage to a control current proportional to the inverse of said VCO output envelope voltage multiplied by the time derivative of said VCO output envelope voltage, and constraining the amplitude of said VCO output voltage by:

supplying said control current to a first node of a low-pass filter having high DC gain;

comparing said VCO output envelope voltage with a reference voltage;

sourcing current to said first node if said VCO output envelope voltage is less than said reference voltage;

sinking current from said first node if said VCO output envelope voltage is greater than said reference voltage;

using the voltage at said first node as a VCO control voltage; and providing said VCO control voltage to the VCO to control said VCO output voltage.

20. The method according to claim 19, wherein converting said VCO output envelope voltage to said control current comprises the steps of:

converting said VCO output envelope voltage to a VCO output envelope current;

supplying said VCO output envelope current to first and second subcircuits generating first and second subcircuit drain currents, said first and second subcircuits being identical except for a capacitance current path for the subcircuit drain current in one of said first and second subcircuits; and subtracting said first subcircuit drain current from said second subcircuit drain current to derive said control current.

* * * * *

UNITED STATES PATENT AND TRADEMARK OFFICE
CERTIFICATE OF CORRECTION

| | | |
|---|---|---|
| PATENT NO. | : 6,137,375 | Page 1 of 1 |
| APPLICATION NO. | : 09/322448 | |
| DATED | : October 24, 2000 | |
| INVENTOR(S) | : Li | |

It is certified that error appears in the above-identified patent and that said Letters Patent is hereby corrected as shown below:

Column 1, line 6, please insert the following header and paragraph:

-- Statement Regarding Federally Sponsored Research or Development
This invention was made with government support under grant number 9703163 awarded by the National Science Foundation. The government has certain rights in the invention. --

Signed and Sealed this

Twenty-ninth Day of July, 2008

JON W. DUDAS
*Director of the United States Patent and Trademark Office*